United States Patent
Gertenbach et al.

(10) Patent No.: US 9,741,714 B2
(45) Date of Patent: Aug. 22, 2017

(54) INDUCTOR STRUCTURE

(75) Inventors: Johan Lucas Gertenbach, Cambridge (GB); Anthony Lawrence McFarthing, Cambridgeshire (GB)

(73) Assignee: QUALCOMM TECHNOLOGIES INTERNATIONAL, LTD., San Diego, CA (US)

(*) Notice: Subject to any disclaimer, the term of this patent is extended or adjusted under 35 U.S.C. 154(b) by 806 days.

(21) Appl. No.: 13/601,861

(22) Filed: Aug. 31, 2012

(65) Prior Publication Data

US 2012/0326826 A1    Dec. 27, 2012

Related U.S. Application Data

(62) Division of application No. 12/904,710, filed on Oct. 14, 2010, now Pat. No. 8,344,841.

(30) Foreign Application Priority Data

Oct. 16, 2009 (GB) .................................. 0918221.3

(51) Int. Cl.
   *H01F 38/20*    (2006.01)
   *H01F 5/00*     (2006.01)
   (Continued)

(52) U.S. Cl.
   CPC ............ *H01L 27/08* (2013.01); *H01F 27/346* (2013.01); *H01L 23/5227* (2013.01);
   (Continued)

(58) Field of Classification Search
   CPC ............. H01F 17/0013; H01F 27/2804; H01F 2017/348; H01F 5/003; H01L 23/5227; H01L 23/645
   (Continued)

(56) References Cited

U.S. PATENT DOCUMENTS 4,774,632 A * 9/1988 Neugebauer ............ H01L 23/32
                                                    257/718
5,389,876 A * 2/1995 Hedengren et al. ........... 324/242
(Continued)

FOREIGN PATENT DOCUMENTS

JP    2007288741 A    11/2007

OTHER PUBLICATIONS

German Office Action issued Aug. 16, 2012, in corresponding German application.

*Primary Examiner* — Alexander Talpalatski
*Assistant Examiner* — Joselito Baisa
(74) *Attorney, Agent, or Firm* — The Marbury Law Group, PLLC

(57) ABSTRACT

An inductor structure includes a first inductor and a second inductor. The second inductor includes a loop that surrounds the first inductor. The first inductor includes a first loop and a second loop, and a crossover section coupling the first loop to the second loop so as to cause current flowing through the first inductor to circulate around the first loop in a first rotational direction and around the second loop in a second rotational direction opposite to the first rotational direction; wherein the first and second inductors are arranged in an equilibrated configuration about a first axis that bisects the inductor structure such that the first loop is on one side of the first axis and the second loop is on a second side of the first axis, such that the magnetic interaction between the inductors due to current flow in the inductors is cancelled out.

20 Claims, 5 Drawing Sheets

(51) Int. Cl.
   *H01L 27/08* (2006.01)
   *H01F 27/34* (2006.01)
   *H01L 23/522* (2006.01)
   *H01F 17/00* (2006.01)

(52) U.S. Cl.
   CPC ............ *H01F 2017/0073* (2013.01); *H01L 2924/0002* (2013.01); *H01L 2924/3011* (2013.01)

(58) Field of Classification Search
   USPC ......... 336/199, 200, 207, 208, 222; 257/531
   See application file for complete search history.

(56) References Cited

U.S. PATENT DOCUMENTS

| | | | |
|---|---|---|---|
| 5,412,539 A * | 5/1995 | Elwell | H01L 21/4853 174/255 |
| 5,480,048 A * | 1/1996 | Kitamura | H01L 21/4857 216/13 |
| 5,548,265 A * | 8/1996 | Saito | 336/200 |
| 5,777,538 A | 7/1998 | Schuetz | |
| 6,144,299 A | 11/2000 | Cole | |
| 6,225,677 B1 * | 5/2001 | Kobayashi | 257/531 |
| 6,373,736 B2 * | 4/2002 | Matsumoto | H01F 17/0013 363/147 |
| 6,380,821 B1 * | 4/2002 | Imbornone et al. | 333/25 |
| 6,472,074 B2 * | 10/2002 | Sugimoto | C04B 35/457 428/432 |
| 6,549,096 B2 | 4/2003 | Groves et al. | |
| 6,590,394 B2 | 7/2003 | Wong et al. | |
| 6,707,367 B2 * | 3/2004 | Castaneda et al. | 336/200 |
| 6,798,326 B2 | 9/2004 | Iida | |
| 6,882,263 B2 * | 4/2005 | Yang et al. | 336/200 |
| 6,922,128 B2 | 7/2005 | Vilander et al. | |
| 7,057,488 B2 | 6/2006 | Van Haaren et al. | |
| 7,307,503 B2 | 12/2007 | Kaji et al. | |
| 7,432,794 B2 | 10/2008 | Mattsson | |
| 7,456,723 B2 | 11/2008 | Maeda et al. | |
| 7,460,001 B2 | 12/2008 | Jessie | |
| 7,902,934 B2 | 3/2011 | Nakamura et al. | |
| 7,986,210 B2 | 7/2011 | Gianesello | |
| 8,018,312 B2 | 9/2011 | Kossel et al. | |
| 8,344,841 B2 | 1/2013 | Gertenbach et al. | |
| 2002/0003715 A1 * | 1/2002 | Matsumoto | H01F 17/0013 363/147 |
| 2005/0195063 A1 | 9/2005 | Mattsson | |
| 2006/0033602 A1 | 2/2006 | Mattsson | |
| 2006/0038621 A1 | 2/2006 | Shiramizu et al. | |
| 2009/0051041 A1 * | 2/2009 | Otsuka | G01R 1/07378 257/774 |
| 2010/0045419 A1 * | 2/2010 | Tanabe | 336/200 |

* cited by examiner

INDUCTOR STRUCTURE

RELATED APPLICATIONS

This application is a divisional of U.S. patent application Ser. No. 12/904,710 entitled "Inductor Structure" filed Oct. 10, 2014, the entire contents of which are incorporated herein by reference. This application also claims priority to United Kingdom (GB) Application No. 0918221.3, filed Oct. 16, 2009.

FIELD OF THE INVENTION

This invention relates to inductor structures, for example for use in low noise amplifiers (LNA). The present invention is particularly applicable to LNAs used in transceivers.

BACKGROUND OF THE INVENTION

Inductors are often used in conjunction with transformers in integrated circuits. A problem with such circuits is that inductors and transformers magnetically couple with each other. The resulting currents induced in the components can cause unwanted changes in their behavioural characteristics. To mitigate this problem, integrated circuits are often designed such that inductors and transformers are physically separated as far as is practical. However, inductors and transformers each occupy a large area on chip and it is desirable to minimise the chip area required for an integrated circuit. Furthermore, it is desirable to conserve chip area without compromising the performance of the integrated circuit.

It has been proposed to reduce the area required by a circuit comprising an inductor and a transformer by placing the inductor inside the transformer. Such a design is illustrated on FIG. 1. The inductor 101 comprises a loop which is enclosed by transformer 102. This design is problematic because the magnetic coupling between the inductor and transformer is sufficiently strong to cause either component to positively feedback a frequency generated in the other, thereby leading to a sustained oscillation. Such an unwanted oscillation can severely disrupt the operation of the integrated circuit.

Attempts to reduce unwanted oscillations associated with the design of FIG. 1 include reducing the coupling between the transformer and inductor by: reducing the size of the inductor relative to the transformer; and flipping the phase of the inductor relative to the transformer. Despite such attempts, unwanted oscillations as a result of coupling between the transformer and inductor remain a problem.

There is thus a need for an improved inductor-transformer structure which achieves both a reduction in the chip area occupied by the inductor and transformer, and mutual isolation of the inductor and transformer from each other by a further reduction in the magnetic coupling between the two.

SUMMARY OF THE INVENTION

According to a first aspect of the invention, there is provided an inductor structure comprising: a first inductor and a second inductor; the second inductor comprising a loop that surrounds the first inductor; and the first inductor comprising a first loop and a second loop, and a crossover section coupling the first loop to the second loop so as to cause current flowing through the first inductor to circulate around the first loop in a first rotational direction and around the second loop in a second rotational direction opposite to the first rotational direction; wherein the first and second inductors are arranged in an equilibrated configuration about a first axis that bisects the inductor structure such that the first loop is on one side of the first axis and the second loop is on a second side of the first axis, such that the magnetic interaction between the inductors due to current flow in the inductors is cancelled out.

Suitably, the first and second inductors are symmetrical about the first axis.

Suitably, the first and second inductors are arranged in an equilibrated configuration about a second axis that bisects the inductor structure such that a first half of the first loop and a first half of the second loop lie on one side of the second axis and a second half of the first loop and a second half of the second loop lie on a second side of the second axis.

Suitably, the first and second inductors are symmetrical about the second axis.

Suitably, the loop of the second inductor follows the profile of the first inductor.

Suitably, the area circumscribed by the first loop is equal to the area circumscribed by the second loop.

Suitably, the first loop has an identical size and shape to the second loop.

Suitably, the inductor structure further comprises a third inductor comprising a third loop that surrounds the second inductor, wherein the first, second and third inductors are arranged in an equilibrated configuration about the first axis.

Suitably, the first inductor is of octagonal profile.

Suitably, the second inductor is of octagonal profile.

Suitably, the inductor structure is formed by metallisation on a planar substrate.

According to a second aspect of the present invention, there is provided an integrated circuit including an inductor structure as claimed in any preceding claim.

BRIEF DESCRIPTION OF THE DRAWINGS

The present invention will now be described by way of example with reference to the accompanying drawings. In the drawings.

DETAILED DESCRIPTION OF THE INVENTION

It will be understood in the description that follows that the inductor structure is designed such that substantially complete magnetic isolation of the first inductor from the second inductor (and hence of the second inductor from the first inductor) is achieved. The characteristics described in the description are not intended to necessarily confer absolute mutual magnetic isolation of the inductors from each other as a result of the inductor structure design. Consequently, references in the description to specific relative locations of parts of the inductor structure are to be interpreted to mean that those parts are to be located close enough to the specified location that substantial mutual magnetic isolation of the inductors from each other is achieved. Similarly, references to equalities of areas, sizes, shapes, lengths, magnetic fluxes or similar are to be interpreted to mean that the degree of similarity between the compared quantities is such that substantial mutual magnetic isolation of the inductors from each other is achieved. Similarly, references to the inductor structure or parts of the inductor structure being symmetrical about an axis are to be interpreted to include such structures or parts of structures that, although not exactly symmetrical about the axis, are close enough to exhibiting the mentioned symmetry that substantial mutual magnetic isolation of the inductors from each other is achieved.

Figure 1:
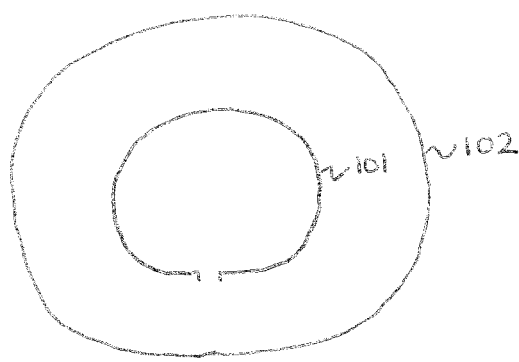
FIG. 1 is a schematic diagram of a prior art inductor-transformer structure.
Figure 2:
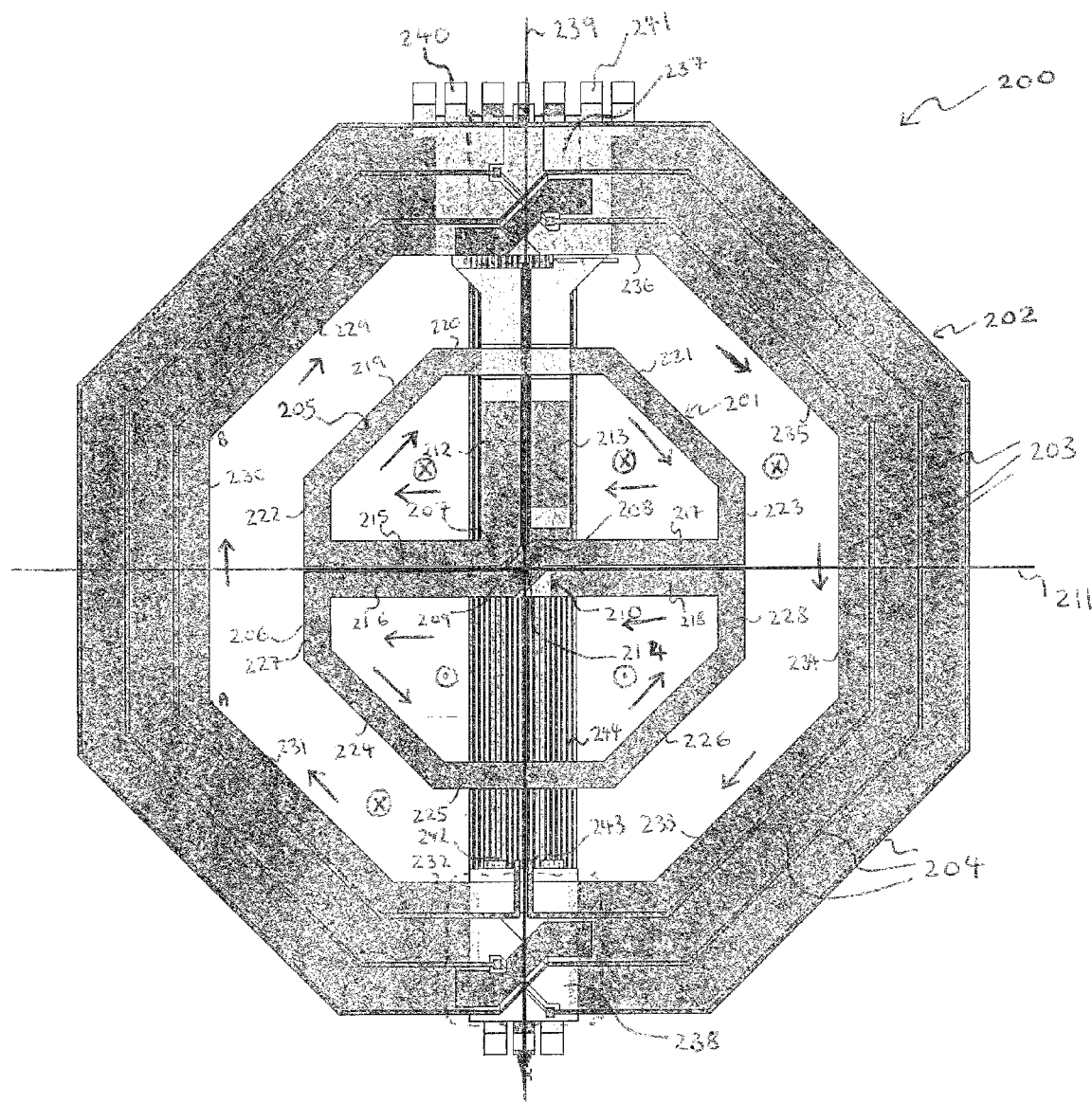
FIG. 2 is a schematic diagram of an inductor structure according to the present invention.

FIG. 2 shows a schematic diagram of the general arrangement of an inductor structure.

The inductor structure 200 comprises a first inductor 201 and a transformer 202. The first inductor comprises a first loop 205 and a second loop 206 connected in a figure-of-8 arrangement. The transformer comprises a loop that encloses the first inductor. The transformer comprises a primary winding 203 and a secondary winding 204. The primary and secondary windings are both inductors, coupled to one another.

The first and second loops of the first inductor are each open. The first loop 205 has two ends 207 and 208, and the second loop has two ends 209 and 210. All four ends of the loops 207, 208, 209, 210 lie in close proximity to each other and an axis 211. The axis 211 bisects the figure-of-8 structure such that the first loop is wholly on one side of the axis and the second loop is wholly on the other side. Preferably, the ends of the first loop 207, 208 and the ends of the second loop 209, 210 are at the centre of the figure-of-8 structure.

A first feed line 212 is connected to a first end of the first loop 207. A second feed line 213 is connected to a first end of the second loop 210. The feed lines extend through the area circumscribed by the first loop 205 to the exterior of the first loop where they cross the boundary of the figure-of-8 structure. Preferably, the feed lines lie parallel to each other. Preferably, the feed lines lie perpendicular to the axis 211 such that the area enclosed by the first loop 205 and the first feed line 212 is equal to the area enclosed by the first loop 205 and the second feed line 213. As an alternative to the position illustrated in FIG. 2, the feed lines may extend out of the plane of the inductor.

The second end of the first loop 208 and the second end of the second loop 209 are coupled by a crossover section 214. In FIG. 2, the crossover section 214 directly connects the second end of the first loop 208 to the second end of the second loop 209. The first end of the first loop 207 lies adjacent to the crossover section 214 on one side of the crossover section. The first end of the second loop 210 lies adjacent to the crossover section 214 on the other side of the crossover section. The crossover section 214 lies wholly within the central region of the figure-of-8 structure. The central region is defined by a circle centred at the centre of the figure-of-8 structure with a radius less than xr. In this definition r is the average length of a straight line connecting the centre point of the figure-of-8 structure to the exterior edge of one of the loops. An exterior edge of a loop is an edge which forms a boundary between the interior and exterior of the figure-of-8 structure. The exterior edges do not include facing edges of the two loops 215, 216, 217, 218 that are adjacent to the axis 211. Preferably x lies in the range ⅓ to ⅛. Most preferably x is ⅐.

The shape and size of the first loop 205 is identical to the shape and size of the second loop 206. The area encompassed by each loop is consequently identical.

The figure-of-8 structure may be of octagonal profile (as depicted in FIG. 2) such that the exterior edges of the first loop are in the shape of half an octagon and the exterior edges of the second loop are in the shape of the other half of the octagon. Preferably, the half octagon of the first loop includes three sides of the octagon 219, 220, 221 and two half sides of the octagon 222, 223. The second loop has identically arranged octagonal sides including three sides of the octagon 224, 225, 226 and two half sides 227, 228. The remaining edges of the loops lie interior to the figure-of-8 structure and connect the exterior edges to the ends of the loops. A first interior edge 215 connects the end point of the exterior edge 222 of the first loop 205 to the first end of the first loop 207. The end point of the exterior edge 222 is the point that lies closest to the axis 211 on the same side of the centre of the figure-of-8 structure as the first end of the first loop 207. Similarly, a second interior edge 217 connects the end point of the exterior edge 223 of the first loop 205 to the second end of the first loop 208. Interior edges 216 and 218 are similarly defined for the second loop 206. Preferably, the interior edges 215, 216, 217 and 218 are straight lines. Preferably, they are parallel to each other and the axis 211.

Alternatively, the figure-of-8 structure may have a four-sided profile, for example a square profile. In such an embodiment, the exterior edges are arranged in a similar manner to the exterior edges of the octagonal profile of FIG. 2, wherein the exterior edges of the first loop are in the shape of half a square and the exterior edges of the second loop are in the shape of the other half of the square. An octagonal profile may be preferred over a four-sided profile because the octagonal profile uses a smaller area on chip to achieve a similar inductance and Q-value (quality value). The octagonal profile inductor advantageously frees up space for other components on chip compared to the four-sided profile inductor.

Each of the first and second loops of the first inductor may consist of two or more turns. Such an arrangement increases the inductance value of the inductor without a corresponding significant increase in the chip area consumed. In such an arrangement, a second turn of a loop runs outside the first turn such that the second turn forms a boundary between the first turn and the exterior of the figure-of-8 structure, and the first turn forms a boundary between the second turn and the interior of the figure-of-8 structure. The first and second turns do not cross over each other at an exterior edge of the figure-of-8 structure. Preferably, the first and second turns of a loop have the same octagonal profile as described in relation to FIG. 2. The crossover section 214 couples the first loop 205 to the second loop 206 by a number of individual inductor crossovers connecting the turns of the loops.

The transformer 202 comprises a second inductor (primary winding 203) and a third inductor (secondary winding 204). The transformer comprises a loop that surrounds the first inductor so as to wholly enclose the first inductor in the plane of the inductor and transformer. Suitably, the edges of the transformer follow the shape of the exterior edges of the first inductor. For example, if the figure-of-8 inductor has exterior edges defining an octagonal profile, then the transformer edges also define an octagonal profile with the same orientation. In FIG. 2, each edge of the transformer 229, 230, 231, 232, 233, 234, 235, 236 is parallel to a corresponding edge of the figure-of-8 inductor 219, 222/227, 224, 225, 226, 228/223, 221, 220 respectively.

Alternatively, the transformer may have a different profile to the first inductor. For example, the transformer may have a four-sided profile, for example a square profile or a rectangular profile. The first inductor and transformer are arranged in an equilibrated configuration about the axis 211. An equilibrated configuration is one for which the net current induced in the transformer by current circulating around the first loop of the first inductor is equal in magnitude but opposite in direction to the net current induced in the transformer by current circulating around the second loop of the first inductor. A suitable equilibrated configuration is one in which the first inductor and transformer are symmetrical about the axis 211. Preferably the first inductor and the transformer are co-axial, meaning that the central point of each component is at the same position in the inductor structure. Alternatively, the first inductor could be placed such that its central point is at a different position to the central point of the transformer. Preferably, the central point of each component lies on the axis 211.

In FIG. 2, the primary winding is depicted as forming the interior edge of the transformer. This interior edge is the edge facing, and closest to, the exterior edge of the first inductor. The secondary winding runs outside the primary winding such that the secondary winding forms a boundary between the primary winding and the exterior of the transformer, and the primary winding forms a boundary between the secondary winding and the interior of the transformer. Alternatively, the primary winding may run outside the secondary winding. Preferably, the secondary winding runs parallel to the primary winding. The ends of the primary winding are connected to respective feed lines 240 and 241. Similarly, the ends of the secondary winding are connected to respective feed lines 242 and 243.

The primary and secondary windings may each comprise a plurality of turns (three for each winding are depicted on FIG. 2). The turns of the primary winding are interleaved with the turns of the secondary winding, such that the transformer comprises alternate turns of the primary and secondary windings. The turns of the primary winding are connected so as to form a continuous structure, and the turns of the secondary winding are connected so as to form a continuous structure. Crossover sections 237 and 238 accommodate the interleaving. The crossover sections lie on a second axis 239 which bisects the transformer and the first inductor such that half of the lower loop 206 and half of the upper loop 205 are on one side of the axis and the other half of the lower loop and the other half of the upper loop are on the other side of the axis. The second axis 239 lies perpendicular to the first axis 211 and crosses the first axis 211 at the centre of the inductor structure.

Each of the turns of the primary winding may be the same width. Alternatively, each subsequent turn of the primary winding may be wider than the previous turn. For example, as shown on FIG. 3, the turns of the primary winding may increase in width from the inside turn of the primary winding (facing the inductor) to the outside turn of the primary winding (facing the outside of the transformer-inductor structure). Similarly, the turns of the secondary winding may be the same width. Alternatively, each subsequent turn of the secondary winding may be wider than the previous turn. For example, the turns of the secondary winding may increase from the outside turn of the secondary winding (facing the outside of the transformer-inductor structure) to the inside turn of the secondary winding (facing the inductor).

The inductor structure operates using alternating current (a.c.). The following description describes the operation of the inductor structure when current flows in the figure-of-8 inductor in a first direction from the first feed line 212 to the second feed line 213, and when current flows in the primary winding of the transformer in a clockwise direction. It will be understood that when the current alternates in the figure-of-8 inductor, the current flows from the second feed line 213 to the first feed line 212. Additionally, when the current alternates in the transformer, the current flows in an anti-clockwise direction around the primary winding. The current may alternate in the figure-of-8 inductor and the transformer in phase. Alternatively, the current may alternate with different phases in the figure-of-8 inductor and transformer.

Current enters the figure-of-8 inductor via the first feed line 212. The current flows around the inductor in the directions indicated by the arrows on FIG. 2. Current leaves the inductor via the second feed line 213. The first loop 205 and the second loop 206 are connected such that current flowing from the first feed line 212 to the second feed line 213 circulates in a first rotational direction around the first loop 205 and in a second opposite rotational direction around the second loop 206. In FIG. 2, the current flows in a clockwise direction around the first loop 205 and in an anticlockwise direction around the second loop 206 as indicated by the arrows on the figure.

In FIG. 2, current enters the primary winding of the transformer via a first feed line 241. The current flows around the primary winding of the transformer in the direction indicated by the arrows (clockwise on FIG. 2). Current leaves the primary winding of the transformer via the second feed line 240. Due to Lenz's law, a current of the opposite direction is induced in the secondary winding. Hence, on FIG. 2, current enters the secondary winding via a first feed line 243 and flows around the secondary winding in an anti-clockwise direction. Current leaves the secondary winding of the transformer via a second feed line 242.

The arrangement of the inductor structure described herein has the effect that the magnetic interaction between the figure-of-8 inductor and the transformer resulting from current flow in the two components is cancelled out. Consequently, the inductor and transformer are magnetically isolated from each other such that neither causes a net induction of current in the other. This isolation can be understood as follows.

The two loops of the figure-of-8 inductor 305, 306 are equal in size and shape (and hence length and area encompassed), hence the magnetic field components radiated by each loop are equal in magnitude but opposite in direction.

At a small section of the transformer marked A on FIG. 2, the magnetic field components resulting from the field radiated by the second loop 206 are greater in magnitude than the magnetic field components resulting from the magnetic field radiated by the first loop 205. This is because the distance between A and the first loop is greater than the distance between A and the second loop. The net effect of current flowing around the figure-of-8 inductor on A is hence to induce a small delta current in the inductor at A in the opposite direction as the current circulation around the second loop. This delta current is in addition to the current fed through the transformer from the feed lines 240 and 241. In the current circulation depicted in FIG. 2, this delta current has a clockwise circulation.

At a small section of the transformer marked B on FIG. 2, the magnetic field components resulting from the field radiated by the first loop 205 are greater in magnitude than the magnetic field components resulting from the magnetic field radiated by the second loop 206. This is because the distance between B and the second loop is greater than the distance between B and the first loop. The net effect of current flowing around the figure-of-8 inductor on B is hence to induce a small delta current in the inductor at B in the opposite direction as the current circulation around the first loop. In the current circulation depicted in FIG. 2, this delta current has an anti-clockwise circulation.

Since the figure-of-8 inductor and the transformer are arranged in an equilibrated configuration about the axis 211, and A and B are equidistant from the axis 211, the magnitude of the delta current induced at A is equal to the magnitude of the delta current induced at B. The delta current at A has an opposite rotational direction to the delta current at B. The contribution to the total current of the transformer by the delta current at A is therefore cancelled or neutralised by the contribution to the total current of the transformer by the delta current at B. The net effect on the total current of the transformer as a result of the delta currents at A and B is therefore zero.

The balanced nature of the structure about the axis 211 means that delta currents induced in any section of the transformer by the magnetic field from the figure-of-8 inductor are cancelled by delta currents induced in another section of the transformer. Consequently, no net current is induced in the transformer as a result of placing the first inductor inside it.

The transformer and figure-of-8 inductor represent a reciprocal network. Similar reasoning to the above applies in the converse situation. In other words, no net current is induced in the figure-of-8 inductor by the magnetic field radiated by the transformer.

The mutual isolation of the transformer and first inductor from each other is limited in the configuration of FIG. 2 by the presence of the feed lines 212 and 213. The magnetic field generated by the first feed line 212 is equal in magnitude but opposite in direction to the magnetic field generated by the second feed line 213 if the feed lines are parallel. If the feed lines are approximated as occupying the same position, then their respective magnetic field contributions cancel each other and they make no contribution to the inductance. However, the feed lines do not occupy the exact same position and consequently they collectively provide a small magnetic field contribution. This is contained wholly within the area of the first loop 205. The feed lines consequently cause the magnetic field radiated by the first loop 205 to differ slightly in magnitude from the magnetic field radiated by the second loop 206. The figure-of-8 inductor could be shifted parallel to the second axis 239 so as to mitigate the effect of the feed lines, thereby maintaining an equilibrated configuration about the first axis 211. The feed lines add to the resistance of the inductor structure which reduces the Q factor (quality factor) of the structure. If the feed lines are placed so as to extend out of the plane of the inductor, then they can advantageously be shorter than those in FIG. 2. Hence the perturbation caused by the feed lines on the magnetic field radiated by the first loop 205 is reduced compared to the arrangement of FIG. 2.

The inductor structure may further comprise a tap 244. The tap 244 connects the inductor structure to a supply voltage.

It will be appreciated by a person skilled in the art that the scope of the present invention extends to including a figure-of-8 inductor comprising any number of turns in each of the loops, and a transformer comprising any number of turns in each of the primary and secondary windings.

Figure 3:
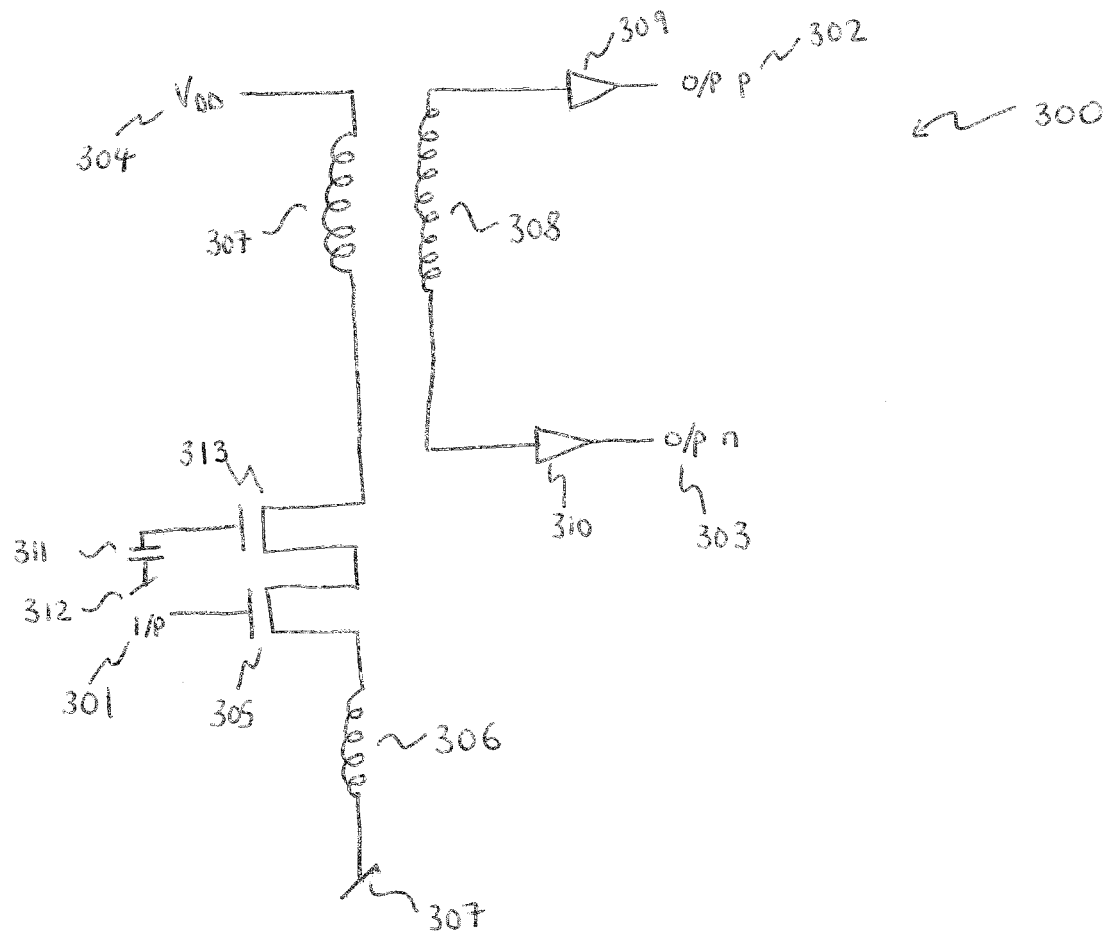
FIG. 3 illustrates a low noise amplifier suitable for incorporating the inductor structure of the present invention.

The inductor structure of the present invention could be suitably implemented in a low noise amplifier. FIG. 3 illustrates a suitable configuration of an LNA 300 for incorporating the inductor structure described herein.

An input signal 301 is connected through a first transistor 305 to the first inductor 306. The other end of the first inductor is connected to ground 307. The input 301 is connected through the first transistor 305 to a further transistor 313 to the primary winding 307 of the transformer. The primary winding is connected at its other end to a voltage supply 304. The primary winding of the transformer is magnetically (but not physically) coupled to the secondary winding 308 of the transformer. The secondary winding is connected at one end to a positive differential output 302 through a buffer 309, and at the other end to a negative differential output 303 through a buffer 310. The buffers are high input impedance, low output impedance devices. The second transistor 313 is further connected to a capacitor 311. Capacitor 311 is connected to ground 312.

An unbalanced input voltage 301 generates an input voltage at the source of transistor 313 if the unbalanced input voltage 301 exceeds the threshold voltage of transistor 305. The first inductor 306 forces any DC offsets in the signal to ground. The remainder of the circuit acts as a common gate amplifier. The circuit of FIG. 3 has a single ended input 301 and a differential output 302, 303. A differential output is used to prevent noise from the power supply 304 affecting the eventual output. Since noise is transferred equally onto both differential outputs 302, 303, the difference between the differential outputs does not contain a noise component.

Figure 4A:
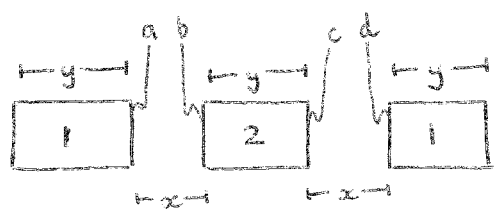
FIGS. 4a, 4b and 4c are cross-sectional views of winding arrangements for the transformer of FIG. 2.
Figure 4B:
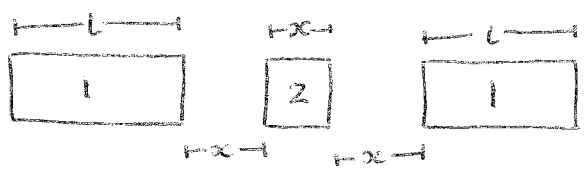
Figure 4C:
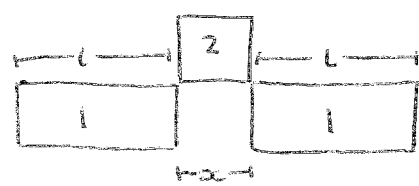

Increasing the impedance of the primary winding 307 of the transformer increases the gain of the amplifier. This can be achieved by increasing the coupling between the turns on the primary winding. FIGS. 4a to 4c illustrate a suitable way in which the coupling between the turns on the primary winding can be increased and the capacitance between the primary and secondary windings can be decreased.

FIG. 4a shows a cross-sectional view of a small section of a metal layer comprising a turn of a secondary winding (marked 2) sandwiched between two turns of a primary winding (marked 1). This view is perpendicular to the top view illustrated in FIG. 2. In FIG. 4a the turns of the primary and secondary windings have width y. Each turn is separated from the adjacent turn by a gap of length x. This gap is inherent in the chip manufacturing process. A typical value of x is 2 µm. The configuration of FIG. 4a is undesirable because it leads to significant capacitance between the turns of the primary and secondary windings. This capacitance comprises primarily parallel plate capacitances established across the gaps between the facing parallel sides of the turns of the windings. For example, in FIG. 4a two significant parallel plate capacitances are established, one between side a and side b, the other between side c and side d.

FIG. 4b shows a similar cross-sectional view to FIG. 4a. The relative widths of the turns on the primary and secondary windings have been modified compared to FIG. 4a. In FIG. 4b the turns on the primary winding (of width l, where l is greater than y) are wider than the turn on the secondary winding (of width x as previously defined). The turns of the primary winding in FIG. 4b are therefore separated by a shorter distance than in FIG. 4a and hence couple more strongly with each other. Hence the primary winding 307 of FIG. 3 has a higher impedance if arranged as shown in FIG. 4b compared to if arranged as shown in FIG. 4a. However, the arrangement of FIG. 4b suffers the same parallel plate capacitance problem suffered by the arrangement of FIG. 4a.

FIG. 4c shows a further cross-sectional view, this time showing two metal layers of the transformer. The turns of the primary winding are in a first metal layer, and the turn of the secondary winding is in a different metal layer adjacent to the first metal layer. Suitably, the primary winding is in a lower metal layer than the secondary winding, the lower metal layer being closer to the substrate layer. The relative widths of the turns of the primary and secondary windings are the same as in FIG. 4b. The turns of the primary winding are adjacent to each other in the first metal layer. They are separated by a gap of length x due to the manufacturing process. The turn of the secondary winding has width x and is placed directly above the gap of length x between the turns of the primary winding. This arrangement has two associated advantages. Firstly, the parallel plate capacitance discussed in relation to FIGS. 4a and 4b is minimised since the edges corresponding to edges a and b (and similarly c and d) in FIG. 4a are no longer facing each other and are no longer separated by any appreciable distance. Using the arrangement of FIG. 4c in the transformer of FIG. 3 therefore results in less primary winding-secondary winding capacitance and hence less loss in the circuit. Secondly, the primary windings are only separated by a distance x in FIG. 4c, compared to distances of 2x+y in FIGS. 4a and 3x in FIG. 4b. The primary windings therefore couple more strongly in the arrangement of FIG. 4c than in the arrangements of FIGS. 4a and 4b. A higher impedance of the primary winding is thereby achieved using the arrangement of FIG. 4c in the transformer of FIG. 3 thereby leading to a greater gain of the amplifier.

Figure 5A:
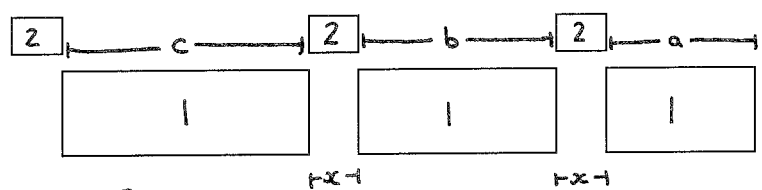
FIGS. 5a, 5b and 5c are cross-sectional views of further winding arrangements for the transformer of FIG. 2.
Figure 5B:
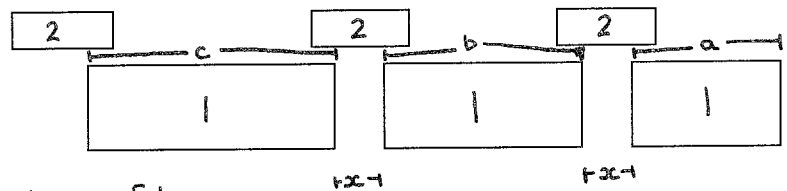
Figure 5C:
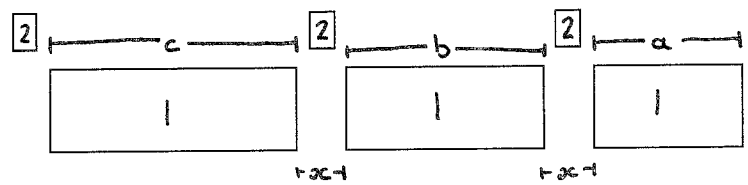

FIGS. 5a to 5c illustrate further suitable arrangements for the primary and secondary windings, in which the turns of the primary winding increase in width and the turns of the secondary winding have the same width. In each of the arrangements in FIGS. 5a to 5c the primary winding and secondary winding are formed in two adjacent metal layers as described with reference to FIG. 4c.

In FIG. 5a, adjacent turns of the primary winding (marked 1) are separated by a gap of length x due to the chip manufacturing process. The turns of the primary winding have increasing width, from length a for the first turn to length b for the second turn and length c for the third turn where c>b>a. The turns of the secondary winding (marked 2) have width x and are placed directly above the gaps of length x between the turns of the primary winding. The arrangement of FIG. 5a is similar to that of FIG. 4c and has the same associated advantages.

In FIG. 5b, the primary winding is arranged as described with respect to FIG. 5a. The widths of the turns of the secondary winding are wider than those shown in FIG. 5a. The turns of the secondary winding are placed above the gaps between turns of the primary winding and partially overlap the turns of the primary winding in the vertical plane. The increased width of the turns of the secondary winding and hence the decreased separation of the turns of the secondary winding causes them to couple more strongly to each other than in the arrangement of FIG. 5a hence there is lower loss in the secondary winding compared to the arrangement of FIG. 5a. However, there is higher capacitance between the primary and secondary winding than in the arrangement of FIG. 5a due to the overlap of the turns of the primary and secondary winding. This overlap leads to some parallel plate capacitance and fringing capacitance.

In FIG. 5c, the primary winding is arranged as described with respect to FIG. 5a. The widths of the turns of the secondary winding are narrower than those shown in FIG. 5a. The turns of the secondary winding are placed above the gaps between turns of the primary winding but are not as wide as the separation of the turns of the primary winding. This arrangement exhibits lower fringing capacitance between the turns of the primary winding and secondary winding due to their increased separation. However, there is higher loss associated with the turns of the secondary winding because they have an increased separation and hence couple less strongly than the turns of the secondary winding in FIG. 5a.

The arrangement of FIG. 5a is the preferred arrangement for the primary and secondary windings of the transformer of FIG. 3. The secondary winding drives into a high impedance and the extra series resistance on the secondary winding is small compared to the load impedance.

In preferred embodiments of the invention, the inductor structure is formed by metallisation on a planar substrate. Suitably, the substrate is composed of an electrically insulating material. Suitably, the substrate is polysilicon. A number of metal layers are formed above the substrate layer. Suitably, seven layers of metal are used. The first two metal layers above the substrate are typically used as routing layers. The third and fourth layers are typically used to provide shielding between the inductor structure and the lossy substrate. The fifth layer is used as a crossing-over layer, to accommodate inductor underpasses, for example in the regions 237 and 238 of FIG. 2. The first inductor and the primary winding of the transformer are formed on the sixth metal layer. This metal layer is termed the ultra thick layer. The secondary winding is formed on the seventh metal layer. Suitably, this metal layer is composed of aluminium.

In order to further reduce the chip area used for the circuit of FIG. 3, further components may be placed inside the boundary of the inductor structure. For example, the buffers 309 and 310 could be placed at the base of the structure connected to the ends 242 and 243 of the secondary winding, inside the boundary of the transformer but outside the boundary of the figure-of-8 inductor. In such an arrangement, the secondary winding is wound such that one end of the winding is on the inside of the transformer connected to a buffer. The winding is then wound to the outside of the transformer, and then back to the inside such that the other end of the winding is on the inside of the transformer connected to the other buffer. The capacitor 311 could be placed inside the inductor structure, either: inside the transformer and outside the figure-of-8 inductor; or inside the figure-of-8 inductor. Suitably, the capacitor would be formed on the fourth or fifth metal layer. It is known to put transistors in the substrate layer as dummy fill. Two such transistors could usefully be connected up to the metal layers above, for use as the transistors 305 and 313.

In FIG. 2, the primary winding is wound such that one end of the winding 240 is on the outside of the transformer. The winding is then wound to the inside of the transformer, and then back to the outside such that the other end of the winding 241 is on the outside of the transformer. This enables the primary winding to be connected to the power supply line 304 and transistor 313 if these components are located on the outside of the transformer. Alternatively, the primary could be wound such that its ends are on the inside of the transformer if the components to which it is to be connected are located on the inside of the transformer (as described in the preceding paragraph).

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. An inductor structure comprising:
a plurality of winding turns arranged in a layered structure, the layered structure comprising a substrate layer and a plurality of further layers parallel to the substrate layer;
wherein a first winding turn and a second winding turn of the plurality of winding turns are located in a first layer of the plurality of further layers, said first winding turn and said second winding turn being separated by a gap, and a third winding turn of the plurality of winding turns is located in a second layer of the plurality of further layers; said second layer being adjacent to the first layer such that the third winding turn is placed directly above the gap between the first and second windings; and
wherein the third winding turn is located between the first and second winding turns.

2. An inductor structure as claimed in claim 1, wherein the first layer is adjacent to the second layer.

3. An inductor structure as claimed in claim 1, wherein the first layer is between the substrate layer and the second layer.

4. An inductor structure as claimed in claim 1, wherein the third winding turn is located centrally between the first and second winding turns.

5. An inductor structure as claimed in claim 4, wherein the third winding turn overlaps the first and second winding turns.

6. An inductor structure as claimed in claim 4, wherein edges of the third winding turn meet edges of the first and second winding turns.

7. An inductor structure as claimed in claim 4, wherein there is a gap between edges of the third winding turn and edges of the first and second winding turns.

8. An inductor structure as claimed in claim 4, wherein in the parallel direction of the layers, the first and second winding turns are the same width.

9. An inductor structure as claimed in claim 4, wherein in the parallel direction of the layers, the third winding turn is narrower than the first and second winding turns.

10. An inductor structure as claimed in claim 1, wherein the third winding turn overlaps the first and second winding turns.

11. An inductor structure as claimed in claim 1, wherein edges of the third winding turn meet edges of the first and second winding turns.

12. An inductor structure as claimed in claim 1, wherein there is a gap between edges of the third winding turn and edges of the first and second winding turns.

13. An inductor structure as claimed in claim 1, wherein in the parallel direction of the layers, the first and second winding turns have the same width.

14. An inductor structure as claimed in claim 1, wherein in the parallel direction of the layers, the third winding turn is narrower than the first and second winding turns.

15. An inductor structure as claimed in claim 1, comprising further winding turns located in the first layer.

16. An inductor structure as claimed in claim 1, comprising further winding turns located in the second layer.

17. An inductor structure as claimed in claim 1, wherein the plurality of winding turns are formed by metallization on the substrate layer.

18. An integrated circuit including an inductor structure as claimed in claim 1.

19. An inductor structure comprising:
a plurality of winding turns arranged in a layered structure, the layered structure comprising a substrate layer and a plurality of further layers parallel to the substrate layer;
wherein a first winding turn and a second winding turn of the plurality of winding turns are located in a first layer of the plurality of further layers, said first winding turn and said second winding turn being separated by a gap, and a third winding turn of the plurality of winding turns is located in a second layer of the plurality of further layers, said second layer being adjacent to the first layer such that the third winding turn is placed directly above the gap between the first and second windings; and
wherein in the parallel direction of the layers, the first winding turn is wider than the second winding turn.

20. An inductor structure comprising:
a plurality of winding turns arranged in a layered structure, the layered structure comprising a substrate layer and a plurality of further layers parallel to the substrate layer;
wherein a first winding turn and a second winding turn of the plurality of winding turns are located in a first layer of the plurality of further layers, said first winding turn and said second winding turn being separated by a gap, and a third winding turn of the plurality of winding turns is located in a second layer of the plurality of further layers, said second layer being adjacent to the first layer such that the third winding turn is placed directly above the gap between the first and second windings;
wherein the third winding turn is located centrally between the first and second winding turns; and
wherein in the parallel direction of the layers, the first winding turn is wider than the second winding turn.

* * * * *